United States Patent [19]

Kurata et al.

[11] Patent Number: 5,728,213
[45] Date of Patent: Mar. 17, 1998

[54] METHOD OF GROWING A RARE EARTH SILICATE SINGLE CRYSTAL

[75] Inventors: Yasushi Kurata; Hiroyuki Ishibashi; Kazuhisa Kurashige, all of Tsukuba, Japan

[73] Assignee: Hitachi Chemical Company Ltd., Japan

[21] Appl. No.: 842,483

[22] Filed: Apr. 24, 1997

Related U.S. Application Data

[63] Continuation-in-part of Ser. No. 706,154, Aug. 30, 1996, abandoned.

[30] Foreign Application Priority Data

Aug. 31, 1995 [JP] Japan ..................... 7-233442
Aug. 31, 1995 [JP] Japan ..................... 7-233443
Aug. 31, 1995 [JP] Japan ..................... 7-233444

[51] Int. Cl.$^6$ ............................................. C30B 25/04
[52] U.S. Cl. ............................... 117/19; 117/13; 117/928
[58] Field of Search .............................. 117/2, 13, 19, 117/928

[56] References Cited

U.S. PATENT DOCUMENTS 4,975,394  12/1990  Kanzaki et al. ..................... 501/97
5,025,151   6/1991  Melcher ............................. 250/269

FOREIGN PATENT DOCUMENTS 0 493 903 A1  7/1992  European Pat. Off. .

OTHER PUBLICATIONS

"Single Crystal Rare Earth Perovskites–by Pulling From Molten Oxides, for Magnetic Bubble Memories"; Commissariat Energie Atomique.

Utsu and Akiyama, "Growth and Applications of $Gd_2SiO_5$:Ce Scintillators", Journal of Crystal Growth, 109(1/4):385–391 (1991).

Brandle et al., "Czochralski Growth of Rare–Earth Orhtosilicates ($La_2SiO_5$)", Journal of Crystal Growth, 79(1–3):308–315 (1986).

*Primary Examiner*—Felisa Garrett
*Attorney, Agent, or Firm*—Pennie & Edmonds

[57] ABSTRACT

A method of growing a rare earth silicate single crystal from a melt of a starting material containing a rare earth oxide and a silicon oxide, wherein the starting material in which a density of Fe as an impurity is not more 0.1 ppm, a density of Al as an impurity is not more than 0.4 ppm, or the starting material showing a weight loss of not more than 1.0% when heated up to 1,000° C. is used.

This method which makes it possible to stably obtain a rare earth silicate single crystal having a good scintillator performance, such as free of voids and/or non-colored crystals, or may cause no poor fluorescent characteristics due to a compositional deviation of materials.

13 Claims, No Drawings

METHOD OF GROWING A RARE EARTH SILICATE SINGLE CRYSTAL

This is a continuation-in-part of application Ser. No. 08/706,154, filed Aug. 30, 1996, now abandoned.

BACKGROUND OF THE INVENTION

1. Field of the Invention

This invention relates to a method of growing a rare earth silicate single crystal used in scintillators or the like.

2. Description of Related Art

Rare earth silicate single crystals such as a gadolinium silicate (GSO) single crystal are widely used as scintillators, fluorescent substance and so forth.

The gadolinium silicate single crystal is grown by a method of growing a single crystal from a melt of starting materials by, e.g., the Czochralski process, using as materials a rare earth oxide, e.g., gadolinium oxide and a silicon oxide, e.g., silicon dioxide.

In general, scintillation characteristics, such as fluorescent light output, are considered to be adversely affected by impurities such as rare earth elements and transition metals other than the constituent elements, and the crystal is grown with use of a high-purity material ($Gd_2O_3$) of at least 4N having such impurities in a low content. Here, "4N" indicates a grade which guarantees stated purity not lower than 99.99 wt %.

However, when the crystal is grown using such conventional materials, there has been the problem that good scintillation characteristics can not be stably obtained because voids may occur in grown crystal or the crystal may have yellow color.

SUMMARY OF THE INVENTION

An object of the present invention is to provide a method of growing a rare earth silicate single crystal, which makes it possible to stably obtain a rare earth silicate single crystal having good scintillation characteristics, that is, free of voids, non-colored, and/or a good conversion ratio from energy of radiation into fluorescence, when a rare earth silicate single crystal is grown.

To achieve the above object, the present invention provides a method of growing a rare earth silicate single crystal from a melt of a starting material containing a rare earth oxide material and a silicon oxide material, wherein a density of Fe as an impurity of the starting material is not more than 0.1 ppm.

According to another embodiment, the present invention provides a method of growing a rare earth silicate single crystal from a melt of a starting material containing a rare earth oxide material and a silicon oxide material, wherein a density of Al as an impurity of the starting material is not more than 0.4 ppm.

Preferably, a density of Fe is not more than 0.1 ppm and a density of Al is not more than 0.4 ppm in the starting material.

According to still another embodiment, the present invention provides a method of growing a rare earth silicate single crystal from a melt of a starting material containing a rare earth oxide material and a silicon oxide material, wherein the starting material shows a weight loss of not more than 1.0% when heated up to 1,000° C.

This and other objects, features and advantages of the present invention are described in or will become apparent from the following description of the preferred embodiments.

DESCRIPTION OF THE PREFERRED EMBODIMENTS

According to a first embodiment of the present invention, the method makes use of a material having a specific impurity element in a low content, when a rare earth silicate single crystal is grown. It is a method of growing a rare earth silicate single crystal from a melt of a starting material containing a rare earth oxide and a silicon oxide, which is characterized by using the starting material in which a density of Fe as an impurity is not more than 0.1 ppm.

The present inventors studied the relationships between the coloring and scintillation characteristics of a rare earth silicate single crystal, and the impurity density in rare earth oxides and so forth used as starting materials therefor. As the result, they have discovered that a difference in content of a specific impurity element affects the characteristics of a single crystal obtained after crystal growth, and have accomplished the present invention.

In the growth of a gadolinium silicate single crystal, it has been found that a crystal comes to have no color when a starting material containing Fe in a low impurity density is used. Therefor, fluorescent light output and an energy resolution were improved so that the scintillation characteristics could be improved.

According to a second embodiment of the present invention, the method makes use of a rare earth oxide material having a specific impurity element in a low content, when a rare earth silicate single crystal is grown. It is a method of growing a rare earth silicate single crystal from a melt of a starting material containing a rare earth oxide and a silicon oxide, which is characterized by using the starting material in which a density of Al as an impurity is not more than 0.4 ppm.

The present inventors studied the relationships between the occurrence of voids a crystal and scintillation characteristics of a rare earth silicate single crystal, and the impurity density in rare earth oxides and so forth used as starting materials therefor. As the result, they have discovered that a difference in content of a specific impurity element affects the characteristics of a single crystal obtained after crystal growth, and have accomplished the present invention.

In the growth of a gadolinium silicate single crystal, it has been found that a crystal can be free of voids. Therefore fluorescent light output and energy resolution are improved so that the scintillation characteristics can be improved when a starting material containing Al in a low impurity density is used.

According to a third embodiment of the present invention, the method makes use of a rare earth oxide material having absorbed gases and hydrates in a very low content, when a rare earth silicate single crystal is grown. It is a method of growing a rare earth silicate single crystal from a melt of a starting material containing a rare earth oxide and a silicon oxide, which is characterized by using the starting material showing a weight loss of not more than 1.0% when heated up to 1,000° C.

The rare earth oxide materials contain adsorbed gases and hydrates, and hence, when weighed and mixed with silicon dioxide, they are actually often brought into a state of composition with excess silicon dioxide. A delicate deviation in this crystal composition is considered to make a conversion ratio from energy of radiation, for example, gamma rays, into fluorescence worse, so as to adversely affect fluorescent characteristics especially when other rare earth element is added as an emission center.

Then, the present inventors studied the relationships between the degree of weight loss caused when materials such as a rare earth oxide are heated and the scintillation characteristics of a rare earth silicate single crystal obtained when the materials are used in crystal growth without heating at 400° C. or above. As the result, they have discovered that scintillation characteristics become poor when a material showing a clear weight loss upon heat treatment at about 1,000° C. is used in the crystal growth of a rare earth silicate single crystal, and have accomplished the present invention.

In the growth of a gadolinium silicate single crystal, scintillation characteristics of the resulting, rare earth silicate single crystal can be stably improved as a result of improvement of fluorescent light output and energy resolution which are results of improvement of conversion ratio of energy of radium, such as gamma rays, into fluorescence, when starting materials containing a gadolinium oxide ($Gd_2O_3$) showing a weight loss of not more than 1.0% when heated up to 1,000° C. is used, or when the starting materials and/or gadolinium oxide material used is subjected to heat treatment at about 1,000° C. for 20 to 100 hours to bring it into the state as described above and thereafter the oxide thus treated is used as the material. A heat treatment of less than 20 hours can not cause a sufficient weight loss, and a heat treatment of more than 100 hours does not bring further change to the material.

The impurities in materials and the weight loss caused when materials are heated have similar effects and bring about similar results also in respect of rare earth silicate single crystals other than the gadolinium silicate single crystal which are represented by the formula:

$R_2SiO_5$ 

wherein R is La, Ce, Pr, Nd, Pm, Sm, Eu, Tb, Dy, Ho, Er, Tm or Yb.

Additives such as Ce are commonly doped as fluorescent centers in rare earth silicate single crystals. Similar effects arise also in such a case.

The above rare earth silicate single crystals have the same crystal structure as the crystal structure of the gadolinium silicate single crystal, and the crystal structure belongs to space group $P2_1/c$.

EXAMPLES

Comparative Example 1

An instance of a cerium-activated gadolinium silicate single crystal ($Ce:Gd_2SiO_5$; Ce density: 0.5 mol %) is described here as an example. A single crystal was grown by the Czochralski process, using 2,573.5 g of gadolinium oxide ($Gd_2O_3$) 4N (Type A), 426.5 g of silicon dioxide ($SiO_2$) 4N and 5.9 g of cerium oxide ($CeO_2$) 4N as starting materials. They were weighed and mixed. The mixture obtained was fired at 1,200° C., and thereafter charged in an Ir crucible having a 100 mm in diameter to carry out crystal growth. The crystal growth was performed under the conditions such as at 1,950° C. of melt of starting materials, 30 rpm of number of rotation of seed crystal and 2 mm/hour of pulling speed. At the stage when 80% of starting materials is crystallized, the pulling was completed. A single crystal of 50 mm diameter was obtained.

The single crystal thus grown had yellow color. Samples of 10 mm×10 mm×30 mm were taken from the crystal grown, and exposed to gamma rays to measure scintillation characteristics of the samples thus exposed. Results obtained were as shown in Table 1. No good results were obtainable. Impurity content of Fe in the gadolinium oxide material, silicon dioxide material, and cerium oxide material were measured to reveal that it was 1.3 ppm, 0.0005 ppm, and less than 3.5 ppm, respectively. Impurity content of Fe in the starting material exceeded 1.1 ppm.

Example 1

Like Comparative Example 1, instances of cerium-activated gadolinium silicate single crystals ($Ce:Gd_2SiO_5$; Ce density: 0.5 mol %) is described here as an example. Single crystals were grown by the Czochralski process, using 2,573.5 g of gadolinium oxide ($Gd_2O_3$) 4N (Type B) as a material, and 426.5 g of silicon dioxide ($SiO_2$) 4N and 5.9 g of cerium oxide ($CeO_2$) 4N which are entirely the same materials (also having the same purification lot number) as those used in Comparative Example 1. They were weighed and mixed. Each mixture obtained was fired at 1,200° C., and thereafter charged in an Ir crucible to carry out crystal growth under the conditions same as that of Comparative Example 1.

As a result of the crystal growth, single crystals having no color were stably obtained. Samples of 10 mm×10 mm×30 mm were taken from the crystals grown, and exposed to gamma rays to measure scintillation characteristics of the samples thus exposed. Results obtained were as also shown in Table 1. Stable and good scintillation characteristics were obtained. Because of a low content of Fe impurity, an improvement in scintillation characteristics was clearly seen.

Impurity content of Fe in the gadolinium oxide material was measured to reveal that it was 0.1 ppm, showing the result that impurity content of Fe was greatly smaller than the gadolinium oxide material used in Comparative Example 1. Impurity content of Fe in the material was less than 0.093 ppm. Impurity content of Al in the material was 0.22 ppm.

Because the crystal has no color, fluorescence generated in the crystal under exposure of gamma rays reaches efficiently photomultiplier provided in contact with a surface of the crystal. Therefore fluorescent light output and energy resolution are improved, so that scintillation characteristics are improved.

TABLE 1

| Light transmittance and scintillation characteristics when exposed to gamma rays: | | |
|---|---|---|
| | Comparative Example 1 | Example 1 |
| Transmittance (%), 430 nm: | 65 | 80 |
| Fluorescent light output (ch): | 229 | 322 |
| Energy resolution (%) | 10.5 | 8.5 |

Measuring method of Fluorescent light output and Energy resolution

A mirror surface is made at a surface of 10 mm×10 mm of the sample (surfaces having 20 mm in diameter in Comparative Example 3 and Example 3, mentioned later). Surfaces of the sample other than the mirror surface is coated with a reflection layer. On a photoreceiveing head of a photomultiplier (trade name: R878, produced by HAMAMATSU photonics K.K.), the sample is placed so that the mirror surface becomes the bottom.

A voltage of 800 volts is applied to the photomultiplier, and gamma rays emitted from a Cs-137 ray source placed at 100 mm above the sample is irradiated to the photomultiplier.

With the photomultiplier, an energy spectra of gamma rays emitted from the Cs-137 ray source is measured, and then fluorescent light output and an energy resolution are measured.

Comparative Example 2

An instance of cerium-activated gadolinium silicate single crystals (Ce:Gd$_2$SiO$_5$; Ce density: 0.5 mol %) is described here as an example. Single crystals were grown by the Czochralski process, using 2,573.5 g of gadolinium oxide (Gd$_2$O$_3$) 4N (Type C) as a material, and 426.5 g of silicon dioxide (SiO$_2$) 4N and 5.9 g of cerium oxide (CeO$_2$) 4N which are entirely the same materials (also having the same purification lot number) as those used in Comparative Example 1. They were weighed and mixed. Each mixture obtained was fired at 1,200° C., and thereafter charged in an Ir crucible to carry out crystal growth under the conditions same as that of the Comparative Example 1.

The single crystals thus grown had a great number of voids occurred at the lower portion of the ingot. The degree of occurrence of voids was seen non-uniform between the growth ingots.

Samples of 10 mm×10 mm×30 mm were taken from the crystals grown, and exposed to gamma rays to measure scintillation characteristics of the samples thus exposed. Results obtained were as shown in Table 2. No stable and good results were obtainable. Impurity content of Al in the gadolinium oxide material, silicon dioxide material and cerium oxide material were measured to reveal that it was 13.0 ppm, 0.016 pp, and less than 3.5 ppm, respectively. Impurity content of Al in the material exceeded 11.1 ppm.

Example 2

Like Comparative Example 2, an instance of cerium-activated gadolinium silicate single crystals (Ce:Gd$_2$SiO$_5$; Ce density: 0.5 mol %) is described here as an example. Single crystals were grown by the Czochralski process, using 2,573.5 g of gadolinium oxide (Gd$_2$O$_3$) 4N (Type D) as a material, and 426.5 g of silicon dioxide (SiO$_2$) 4N and 5.9 g of cerium oxide (CeO$_2$) 4N which are entirely the same materials (also having the same purification lot number) as those used in Comparative Example 2. They were weighed and mixed. Each mixture obtained was fired at 1,200° C., and thereafter charged in an Ir crucible to carry out crystal growth under the conditions same as that of Comparative Example 1.

As a result of the crystal growth, single crystals being free of voids were stably obtained. Samples of 10 mm×10 mm×30 mm were taken from the crystals grown, and exposed to gamma rays to measure scintillation characteristics of the samples thus exposed. Results obtained were as also shown in Table 2. Stable and good scintillation characteristics were obtained. Because of a low content of Al impurity, an improvement in crystal characteristics was clearly seen.

Impurity content of Al in the gadolinium oxide material was measured to reveal that it was 0.35 ppm, showing the result that impurity content was greatly smaller than the gadolinium oxide material used in Comparative Example 2. Impurity content of Fe in the material is less than 0.31 ppm.

Because no voids occur in the crystals, fluorescence generated in the crystal under exposure of gamma rays reaches efficiently photomultiplier. Therefore fluorescent light output and energy resolution are improved, so that scintillation characteristics are improved.

TABLE 2

| Occurrence of voids and Light transmittance when exposed to gamma rays: | | |
|---|---|---|
| | Comparative Example 2 | Example 2 |
| Occurrence of voids (number of ingots having voids/ number of ingots checked): | 3/6 | 0/5 |
| Transmittance (%), 430 nm: | 60 | 80 |

Comparative Example 3

An instance of a cerium-activated gadolinium silicate single crystal (Ce:Gd$_2$SiO$_5$; Ce density: 0.5 mol %) is described here as an example. A single crystal was grown by the Czochralski process, using 2,573.5 g of gadolinium oxide (Gd$_2$O$_3$) 4N (Type E) as a material, and 426.5 g of silicon dioxide (SiO$_2$) 4N and 5.9 g of cerium oxide (CeO$_2$) 4N which are entirely the same materials (also having the same purification lot number) as those used in Comparative Example 1. The respective materials were used as received. They were weighed and mixed. The mixture obtained was fired at 1,200° C., and thereafter charged in an Ir crucible to carry out crystal growth under the conditions same as that of the Comparative Example 1.

From the single crystal thus grown, samples of pillar having 25 mm in diameter×100 mm in length were taken, and their light transmittance and energy spectra of gamma rays emitted from a Cs-137 ray source were measured. Results of measurement were as shown in Table 3.

Each of the gadolinium oxide material, silicon dioxide material and cerium oxide material used in this crystal growth was heated up to 1,000° C. to examine its change in weight. As a result, a weight loss of 1.3%, less-than 0.1% and less than 0.1% was observed, respectively. A weight loss of the material exceeded 1.1%.

Example 3

Like Comparative Example 3, an instance of a cerium-activated gadolinium silicate single crystal (Ce:Gd$_2$SiO$_5$; Ce density: 0.5 mol %) is described here as an example. A single crystal was grown by the Czochralski process, using gadolinium oxide (Gd$_2$O$_3$) 4N (Type B) as a material, and silicon dioxide (SiO$_2$) 4N and cerium oxide (CeO$_2$) 4N which are entirely the same materials (also having the same purification lot number) as those used in Comparative Example 3. Like Comparative Example 3, the materials were used as received, and the same procedure was repeated to carry out crystal growth under the conditions same as that of the Comparative Example 1.

From the single crystal thus grown, samples having 25 mm in diameter×100 mm in length were taken, and their light transmittance and energy spectra of gamma rays emitted from a Cs-137 ray source were measured. Results of measurement were as also shown in Table 3. The results show that both the light transmittance at a fluorescent wavelength of 430 nm and the scintillation characteristics of the GSO (Gadolinium-Silicon-Oxygen) single crystals were improved compared with those of the Comparative Example.

The gadolinium oxide material used in this crystal growth was heated up to 1,000° C. to examine its change in weight. As a result, its weight loss was as small as 1.0%. A weight loss of the starting material is suppressed not more than 0.88%.

TABLE 3

Light transmittance and scintillation characteristics of GSO single crystals:

|  | Comparative Example 3 | Example 3 |
|---|---|---|
| Transmittance (%), 430 nm: | 79 | 80 |
| Fluorescent light output (ch): | 398 | 434 |
| Energy resolution (%) | 9.2 | 8.7 |

As described above, the method of growing a rare earth silicate single crystal according to the first embodiment of the present invention makes it possible to grow a rare earth silicate single crystal free of colored crystal and having good scintillation performance stably.

The method of growing a rare earth silicate single crystal according to the second embodiment of the present invention makes it possible to grow a rare earth silicate single crystal free of voids, and having good scintillation performance, stably.

The method of growing a rare earth silicate single crystal according to the third embodiment of the present invention makes it possible to prevent poor fluorescent characteristics due to a compositional deviation of materials, caused by adsorbed gases and hydrates contained in rare earth oxide materials.

Comparative Example 4

An instance of a cerium-activated gadolinium silicate single crystal (Ce:$Gd_2SiO_5$; Ce density: 0.5 mol %) is described here as an example. A single crystal was grown by the Czochralski process, using 2,573.5 g of gadolinium oxide ($Gd_2O_3$) 4N (Type F) as a material, and 426.5 g of silicon dioxide ($SiO_2$) 4N and 5.9 g of cerium oxide ($CeO_2$) 4N which are entirely the same materials (also having the same purification lot number) as those used in Comparative Example 1. The respective materials were used as received. The were weighed and mixed. The mixture obtained was fired at 1,200° C., and thereafter charged in an Ir crucible to carry out crystal growth under the conditions same as that of the Comparative Example 1.

From the single crystal thus grown, samples of pillar having 10 mm×10 mm×30 mm were taken, and their light transmittance and energy spectra of gamma rays emitted from a Cs-137 ray source were measured. Results of measurement were as shown in Table 4.

Each of the gadolinium oxide material, silicon dioxide material and cerium oxide material used in this crystal growth was heated up to 1,000° C. to examine its change in weight. As a result, a weight loss of 1.3%, less than 0.1% and less than 0.1% was observed, respectively. A weight loss of the material is not less than 1.1%.

Example 4

Like Comparative Example 4, an instance of a cerium-activated gadolinium silicate single crystal (Ce:$Gd_2SiO_5$; Ce density: 0.5 mol %) is described here as an example. A single crystal was grown by the Czochralski process, using gadolinium oxide ($Gd_2O_3$) 4N (Type F) as a material, and silicon dioxide ($SiO_2$) 4N and cerium oxide ($CeO_2$) 4N which are entirely the same materials (also having the same purification lot number) as those used in Comparative Example 4.

In this instance, only the material gadolinium oxide was used after it was heated at 1,100° C. for 20 hours before weighed. Silicon dioxide and cerium oxide materials were used as they were, which were supplied from a manufacturer.

From the single crystal thus grown, samples having 10 mm×10 mm×30 mm were taken, and their light transmittance and energy spectra of gamma rays emitted from a Cs-137 ray source were measured. Results of measurement were as also shown in Table 4. The results show that both the light transmittance at a fluorescent wavelength of 430 nm and the scintillation characteristics of the GSO (Gadolinium-Silicon-Oxygen) single crystals were improved compared with those of the Comparative Example 4.

The gadolinium oxide material used in this crystal growth was heated up to 1,000° C. to examine its change in weight. As a result, its weight loss was as small as 1.0%. A weight loss of the starting material is suppressed not more than 0.88%.

TABLE 4

Light Transmittance and Scintillation Characteristics of GSO Single Crystals

|  | Comparative Example 4 | Example 4 |
|---|---|---|
| Transmittance (%), 430 nm | 76 | 78 |
| Fluorescent light output (ch) | 210 | 228 |
| Energy resolving power (%) | 9.0 | 8.4 |

We claim:

1. A method of growing a rare earth silicate single crystal from a melt of a starting material containing a rare earth oxide material and a silicon oxide material, wherein a density of Fe as an impurity of said starting material is not more than 0.1 ppm.

2. The method of growing a rare earth silicate single crystal according to claim 1, wherein a density of Fe as an impurity of the rare earth oxide material is not more than 0.1 ppm.

3. The method of growing a rare earth silicate single crystal according to claim 1, wherein the rare earth oxide is gadolinium oxide.

4. The method of growing a rare earth silicate single crystal according to claim 1, wherein a density of Al as an impurity of said starting material is not more than 0.4 ppm.

5. A method of growing a rare earth silicate single crystal from a melt of a starting material containing a rare earth oxide material and a silicon oxide material, wherein a density of Al as an impurity of said starting material is not more than 0.4 ppm.

6. The method of growing a rare earth silicate single crystal according to claim 5, wherein a density of Al as an impurity of the rear earth oxide material is not more than 0.4 ppm.

7. The method of growing a rare earth silicate single crystal according to claim 5, wherein the rare earth oxide is gadolinium oxide.

8. A method of growing a rare earth silicate single crystal from a melt of a starting material containing a rare earth oxide material and a silicon oxide material, wherein said starting material shows a weight loss of not more than 1.0% when heated up to 1,000° C.

9. The method of growing a rare earth silicate single crystal according to claim 8, wherein the rare earth oxide is gadolinium oxide.

10. A method of growing a rare earth silicate single crystal from a melt of a starting material containing a rare earth oxide material and a silicon oxide material, wherein at least one of said starting material and the rare earth oxide material had been heated at not less than 1,000° C. for not less than 20 hours.

11. The method of growing a rare earth silicate single crystal according to claim 10, wherein the rare earth oxide is gadolinium oxide.

12. A method of growing a rare earth silicate single crystal from a melt of a starting material containing a rare earth oxide material and a silicon oxide material, wherein the rare earth oxide material shows a weight loss of not more than 1.0% when heated up to 1,000° C.

13. The method of growing a rare earth silicate single crystal according to claim 12, wherein the rare earth oxide is gadolinium oxide.

* * * * *